United States Patent
Afridi et al.

(10) Patent No.: US 10,298,058 B2
(45) Date of Patent: May 21, 2019

(54) WIRELESS POWER TRANSFER

(71) Applicant: THE REGENTS OF THE UNIVERSITY OF COLORADO, A BODY CORPORATE, Denver, CO (US)

(72) Inventors: Khurram K. Afridi, Boulder, CO (US); Ashish Kumar, Boulder, CO (US); Zoya Popovic, Boulder, CO (US); Dragan Maksimovic, Boulder, CO (US); Chieh-Kai Chang, Boulder, CO (US); Guilherme Goularte Da Silva, Boulder, CO (US); Saad Pervaiz, Boulder, CO (US)

(73) Assignee: THE REGENTS OF THE UNIVERSITY OF COLORADO, A BODY CORPORATE, Denver, CO (US)

( * ) Notice: Subject to any disclaimer, the term of this patent is extended or adjusted under 35 U.S.C. 154(b) by 0 days.

(21) Appl. No.: 15/571,775

(22) PCT Filed: May 4, 2016

(86) PCT No.: PCT/US2016/030854
§ 371 (c)(1),
(2) Date: Nov. 3, 2017

(87) PCT Pub. No.: WO2016/179329
PCT Pub. Date: Nov. 10, 2016

(65) Prior Publication Data
US 2018/0166915 A1 Jun. 14, 2018

Related U.S. Application Data

(60) Provisional application No. 62/156,870, filed on May 4, 2015.

(51) Int. Cl.
*H02J 50/05* (2016.01)
*H02J 50/70* (2016.01)
(Continued)

(52) U.S. Cl.
CPC .............. *H02J 50/05* (2016.02); *H02J 7/025* (2013.01); *H02J 50/40* (2016.02); *H02J 50/70* (2016.02); *B60L 11/1809* (2013.01); *H03H 7/38* (2013.01)

(58) Field of Classification Search
CPC .. H02J 50/05; H02J 50/70; H02J 7/025; H02J 50/40; B60L 11/1809; H03H 7/38
See application file for complete search history.

(56) References Cited

U.S. PATENT DOCUMENTS

2007/0017168 A1 7/2007 Perreault et al.
2010/0018437 A1 1/2010 Toda et al.
(Continued)

*Primary Examiner* — Robert L Deberadinis
(74) *Attorney, Agent, or Firm* — FisherBroyles, LLP; Thomas J. Osborne, Jr.

(57) ABSTRACT

A capacitive wireless power transfer (WPT) architecture that provides for dynamic (i.e., in motion) and/or stationary power transfer is provided. In various implementations, for example, the capacitive WPT architecture can achieve high power transfer levels at high efficiencies while maintaining fringing field strengths within acceptable safety limits. In one implementation, for example, a multi-module capacitive wireless power transfer system provides a capacitive charging system, such as for, but not limited to, charging electric vehicles (EV). In another implementation, a capacitive wireless power transfer module is provided. The module, for example, comprises a plurality of first coupling plates adapted to be coupled to a power source via an inverter; a plurality of second coupling plates adapted to be coupled to a load and to the plurality of first coupling plates for receiving wireless power and a matching network adapted to provide reactive compensation and gain.

25 Claims, 15 Drawing Sheets

(51) Int. Cl.
*H02J 7/02* (2016.01)
*H02J 50/40* (2016.01)
*B60L 11/18* (2006.01)
*H03H 7/38* (2006.01)

(56) References Cited

U.S. PATENT DOCUMENTS

| | | |
|---|---|---|
| 2011/0026688 A1 | 11/2011 | Kim et al. |
| 2011/0028534 A1 | 11/2011 | Widmer et al. |
| 2012/0016913 A1 | 7/2012 | Choudhary et al. |
| 2013/0007302 A1 | 1/2013 | Alatorre et al. |
| 2013/0343106 A1 | 12/2013 | Perreault et al. |
| 2014/0011115 A1 | 1/2014 | Vincent et al. |
| 2014/0016752 A1 | 6/2014 | Van Goor et al. |
| 2015/0011573 A1 | 4/2015 | Choudhary et al. |

WIRELESS POWER TRANSFER

CROSS-REFERENCE TO RELATED APPLICATIONS

This application claims the benefit of U.S. provisional application No. 62/156,870, filed 4 May 2015, which is hereby incorporated by reference including all appendices as though fully set forth herein.

BACKGROUND a. Field

The present disclosure relates to a capacitive wireless power transfer system and method.

b. Background

Currently most near-field (i.e., non-radiative) wireless power transfer (WPT) systems are inductive and rely on magnetic coupling between coils to transfer energy across an air gap. These inductive WPT systems use expensive ferrite cores for magnetic flux guidance and shielding. To limit high frequency losses in the ferrite material, the operating frequencies of these systems are typically limited to under a hundred kilohertz, resulting in large coils that compromise power transfer density.

An attractive alternative to inductive WPT systems are capacitive WPT systems, which utilize electrically coupled pairs of metal plates for power transfer. Each contactless plate-pair forms a capacitor, which when excited by an ac source and suitably compensated, can transfer power wirelessly. One advantage of capacitive WPT over inductive WPT is that it does not require ferrites for flux guidance. This can greatly reduce system cost and weight, while also enabling high-frequency operation to achieve higher power transfer densities. In addition, since electric fields are inherently better-constrained in space than magnetic fields, capacitive WPT systems produce far less EMI. Capacitive WPT systems can also transfer power across metallic barriers. Despite these benefits, achieving high power transfer levels at high efficiencies in capacitive WPT systems presents unique design challenges.

Some challenges to achieving effective and efficient power transfer in capacitive WPT systems include low coupling capacitance, and high electric field strengths in the vicinity of the coupling plates. Low coupling capacitance necessitates the design of suitable gain and compensation networks. The challenge of high fringing electric field strength poses a potential safety hazard in the deployment of capacitive WPT systems in environments where human and animal safety is of concern.

BRIEF SUMMARY

A capacitive wireless power transfer (WPT) architecture that provides for dynamic (i.e., in motion) and/or stationary power transfer is provided. In various implementations, for example, the capacitive WPT architecture can achieve high power transfer levels at high efficiencies while maintaining fringing field strengths within acceptable safety limits.

In one implementation, for example, a multi-module capacitive wireless power transfer system provides a capacitive charging system, such as for, but not limited to, charging electric vehicles (EV). In a particular EV application, for example, a multi-module approach uses multiple conducting plates on a vehicle (e.g., vehicle bottom) that capacitively couple with corresponding plates that are not disposed on the vehicle. The non-vehicular plates, for example, may be located in or on a road, a garage (e.g., on or in a garage floor, wall, ceiling or suspended, raised or projecting from a garage floor wall or ceiling), a parking space or other location adapted to capacitively couple with the plates on an EV. Although many implementations discussed herein describe various EV charging systems, the present disclosure is not limited to these particular applications. One of ordinary skill in the art would readily appreciate that a capacitive wireless power transfer system would also be applicable in other applications, such as but not limited to trains, buses, off-road vehicles, autonomous vehicles; farm, industrial and manufacturing equipment and robots; stoves and other household appliances; portable, handheld and mobile devices; computer devices; biomedical implants, RFID tags, smart cards, integrated circuits; generators, motors and lighting; drones, aircraft, helicopters, space craft and satellites.

In some implementations, a capacitive wireless power transfer system may provide reduced losses, increased power transfer density and/or substantially reduced cost, compared to state-of-the-art inductive WPT solutions.

Various implementations include one or more of the following features: (1) capacitive energy transfer with distributed plates designed for field cancellation using near-field phased array field focusing concepts; (2) a plurality of matching networks adapted to compensate for the reactance of the capacitive interface and provide voltage or current gain, and (3) efficient, inverters and rectifiers operating within an ISM band (e.g., 6.78 MHz, 13.56 MHz, 27.12 MHz, etc). In one implementation, for example, a 1-kW 12-cm air gap capacitive WPT system, which targets greater than 90% efficiency and 50 $kW/m^2$ power transfer density using ultra-efficient radio frequency power conversion and field focusing may be provided.

In one implementation, for example, a multi-module capacitive wireless power transfer system is provided. The system comprises a first capacitive wireless power transfer module including a plurality of first module first coupling plates adapted to receive a voltage or current at an operating frequency having a first phase and a plurality of first module second coupling plates adapted to be coupled to the plurality of first module first coupling plates for receiving wireless power. The system also includes a second capacitive wireless power transfer module including a plurality of second module first coupling plates adapted to receive a voltage or current at an operating frequency having a second phase different from the first phase and a plurality of second module second coupling plates adapted to be coupled to the plurality of second module first coupling plates for receiving wireless power.

In another implementation, a capacitive wireless power transfer module is provided. The module comprises a plurality of first coupling plates adapted to be coupled to a power source via an inverter; a plurality of second coupling plates adapted to be coupled to a load and to the plurality of first coupling plates for receiving wireless power; and a matching network. The matching network is adapted to provide reactive compensation and gain between at least one of the: the inverter and the plurality of first coupling plates, and the plurality of second coupling plates and the load. The matching network comprises a reactive matching network comprising at least two reactive components and a transformer.

In yet another implementation, a method of providing capacitive wireless power transfer is provided. The method comprises providing a plurality of first coupling plates adapted to be coupled to a power source and providing a plurality of second coupling plates adapted to be coupled to the plurality of first coupling plates for receiving wireless power. The method also provides reactive compensation and gain between the plurality of first coupling plates. The operation of providing reactive compensation and gain comprises providing a matching network adapted to provide reactive compensation and gain between at least one of the: the inverter and the plurality of first coupling plates, and the plurality of second coupling plates and the load. The matching network comprises a reactive matching network comprising at least two reactive components and a transformer.

The foregoing and other aspects, features, details, utilities, and advantages of the present invention will be apparent from reading the following description and claims, and from reviewing the accompanying drawings.

DETAILED DESCRIPTION

In various implementations, multi-module capacitive wireless power transfer (WPT) architectures are provided that employ a plurality of phase-shifted capacitive wireless power transfer modules to achieve effective power transfer between objects while reducing fringe field strength in one or more surrounding regions or zones. For example, in some implementations, the multi-module capacitive WPT architectures use the phase shifts to reduce fringe electric fields so as to maintain the field strengths in surrounding regions or zones within predetermined prescribed limits for human and animal safety as set by the International Commission on Non-Ionizing Radiation Protection (ICNIRP) or the Institute of Electrical and Electronics Engineers (IEEE). The ICNIRP Guidelines For Limiting Exposure to Time-Varying Electric, Magnetic and Electromagnetic Fields (up to 300 GHz) published in Health Physics 74 (4):494-522 (1998) and IEEE Std C95.1-2005, IEEE Standard for Safety Levels with Respect to Human Exposure to Radio Frequency Electromagnetic Fields, 3 kHz to 300 GHZ are each incorporated by reference in their entirety as if fully set forth herein. Field strengths in safety-critical regions, for example, can be reduced by independently controlling the relative phase of different modules such that fields generated by adjacent modules in these regions have a cancelling effect on one another. This multi-module capacitive wireless power transfer architecture also maintains effective power transfer through the use of matching network(s), inverter(s) and/or rectifier(s) in one or more of the individual modules of the multi-module capacitive WPT architecture.

Figure 1:
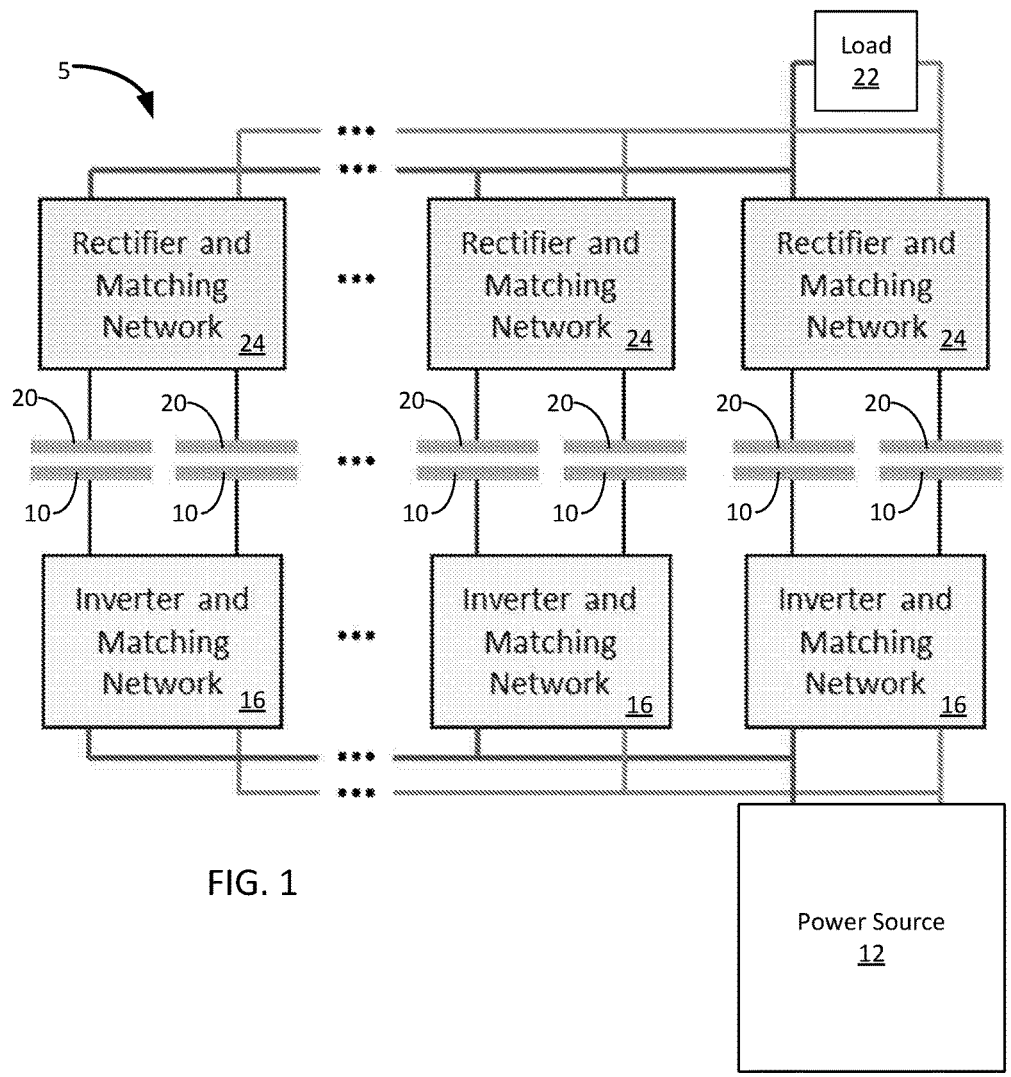
FIG. 1 is a schematic diagram of an example implementation of a multi-module capacitive wireless power transfer system.

FIG. 1 shows a schematic diagram of an example architecture of a multi-module capacitive wireless power transfer system 5. In the implementation shown in FIG. 1, the capacitive wireless power transfer system 5 receives power from a power source 12 and provides wireless power transfer to supply a load 8. The power supply, for example, may comprise any type of ac or dc power supply coupled to the inverter and/or matching network shown in FIG. 1. For example, the power supply may include an ac power source, such as an ac grid power source, coupled to the inverter and/or matching network through an ac/dc converter. Similarly, a dc power source may comprise any dc power supply coupled to the capacitive wireless power transfer system 5 via the inverter and/or matching network.

The load may comprise also any ac or dc load. For example, the wireless power transfer system 5 may wirelessly provide a battery charging voltage or current to a dc battery load via the rectifier and/or matching network. Other implementations are also contemplated in which any dc or ac load may be used.

In the implementation of FIG. 1, for example, a plurality of primary conducting plates 10 are coupled to a power source 12, such as via an inverter and/or matching network 16 shown in FIG. 1. The primary conducting plates 10 are adapted to be capacitively coupled with secondary conducting plates 20 disposed on a device (e.g., a vehicle or other battery powered device). The capacitive plates 20 are, in turn coupled to a load 22 (e.g., a battery or other load), such as via one or more rectifiers and/or matching networks 24.

In one implementation, the primary coupling plates 10 are provided in a charging location at which the load 22 (e.g., a battery powered device) may dynamically (i.e., while moving) and/or statically (i.e., while stationary) couple to the charging plates 10 via secondary coupling plates 20 disposed on or coupled to the load 22 (e.g., a battery powered device). In an electric vehicle (EV) or hybrid vehicle implementation, the charging location may include, for example, a road, garage, parking space or any other location where a vehicle may be located and adapted to capacitively receive power transferred from or provide power to a power source.

Although various implementations described herein may describe power transfer with respect to a particular direction (e.g., charging a battery from a power source), the systems and methods described herein may provide unidirectional (in either direction, such as charging a battery from a power source or providing power from a battery to another system) or bidirectional power transfer.

Figure 2:
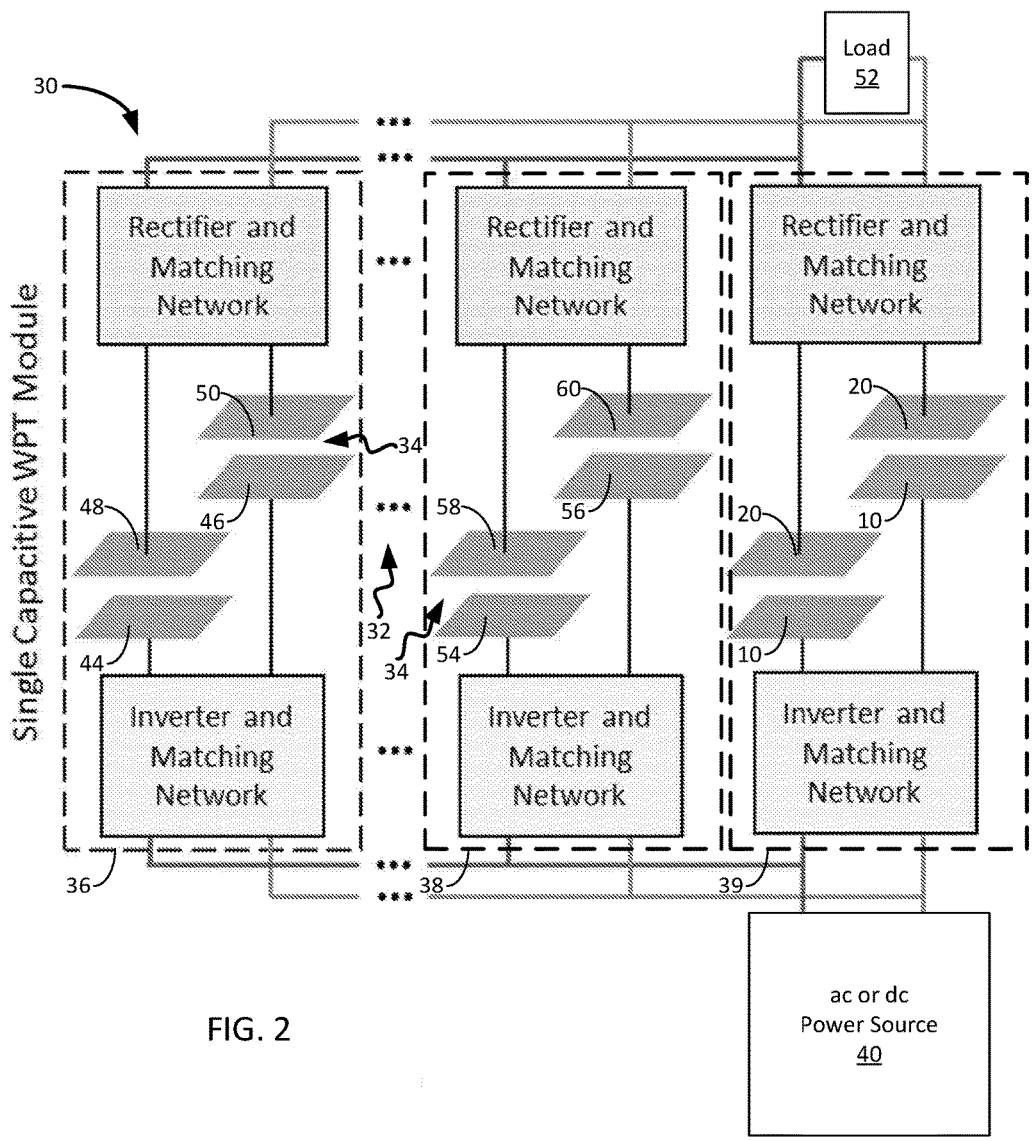
FIG. 2 is a schematic diagram of an example implementation of a multi-module capacitive wireless power transfer system with the capacitive coupling plates shown in three dimensions (3-D).

FIG. 2 shows an example three-dimensional illustration of a multi-module capacitive wireless power transfer system 30, such as for the system shown in FIG. 1. When the adjacent modules of this system are appropriately phase shifted with respect to one another, the electric fields generated by the adjacent plates (for example, plates 46 and 54) oppose each other, resulting in field cancellation or reduction in one or more zones 32 outside one or more capacitive wireless power transmission zones 34.

In the particular example shown in FIG. 2, for example, the capacitive wireless transfer system 30 includes a first capacitive wireless transfer module 36, an adjacent second capacitive wireless transfer module 38 and a third adjacent capacitive wireless transfer system module 39. The first capacitive wireless transfer module 36 is fed by a power source 40 (e.g., a dc or ac power source), which may be the output of a line-frequency ac power source followed by an ac/dc rectifier, or a battery, and includes an inverter and rectifier operating at a frequency $f_s$. The adjacent second wireless transfer module 38 and the third wireless transfer module 39 are fed by the same power source and each include an inverter and rectifier operating at the same frequency $f_s$. The inverter and rectifier of the second and third modules are operated at a phase shift relative to the inverters and rectifiers of the other modules. In a multi-module system with n such modules, the inverters and rectifiers of each module are operated with n such phase shifts, which may be independently generated by controlling the switching timings of the inverters. When appropriately chosen, these phase shifts result in the fields generated by the coupling plates of adjacent modules being oppositely-directed in space, leading to a net field cancelation or reduction in the region surrounding the plates.

The first capacitive wireless transfer module 36 includes a first pair of charging plates 44, 46 and a first pair of coupling plates 48, 50. The first pairs of charging plates 44, 46 and coupling plates 48, 50 provide for power transfer from the voltage source 40 to a load 52.

The second capacitive wireless transfer module 38 includes a second pair of charging plates 54, 56 and a second pair of coupling plates 58, 60. The second pairs of charging plates 54, 56 and coupling plates 58, 60 provide for power transfer from the second voltage source 42 to the load 52.

The third capacitive wireless transfer module 39 includes a third pair of charging plates 62, 64 and a third pair of coupling plates 66, 68. The third pairs of charging plates 62, 64 and coupling plates 66, 68 also provide for power transfer from the voltage source 40 to the load 52.

Although FIGS. 1 and 2 show three modules of the multi-module capacitive wireless power transfer system, the multi-module capacitive wireless power transfer system may include any number of modules (such as one, two or more) and are not limited to only three modules as shown in the examples of FIGS. 1 and 2.

The power electronic components (inverters and rectifiers) of adjacent capacitive wireless transfer modules may be operated with any phase shift (0 to 180 degrees) between them. A phase difference of 180 degrees between adjacent modules, for example, provides maximum field cancellation between the adjacent plates of the modules.

Figure 3:
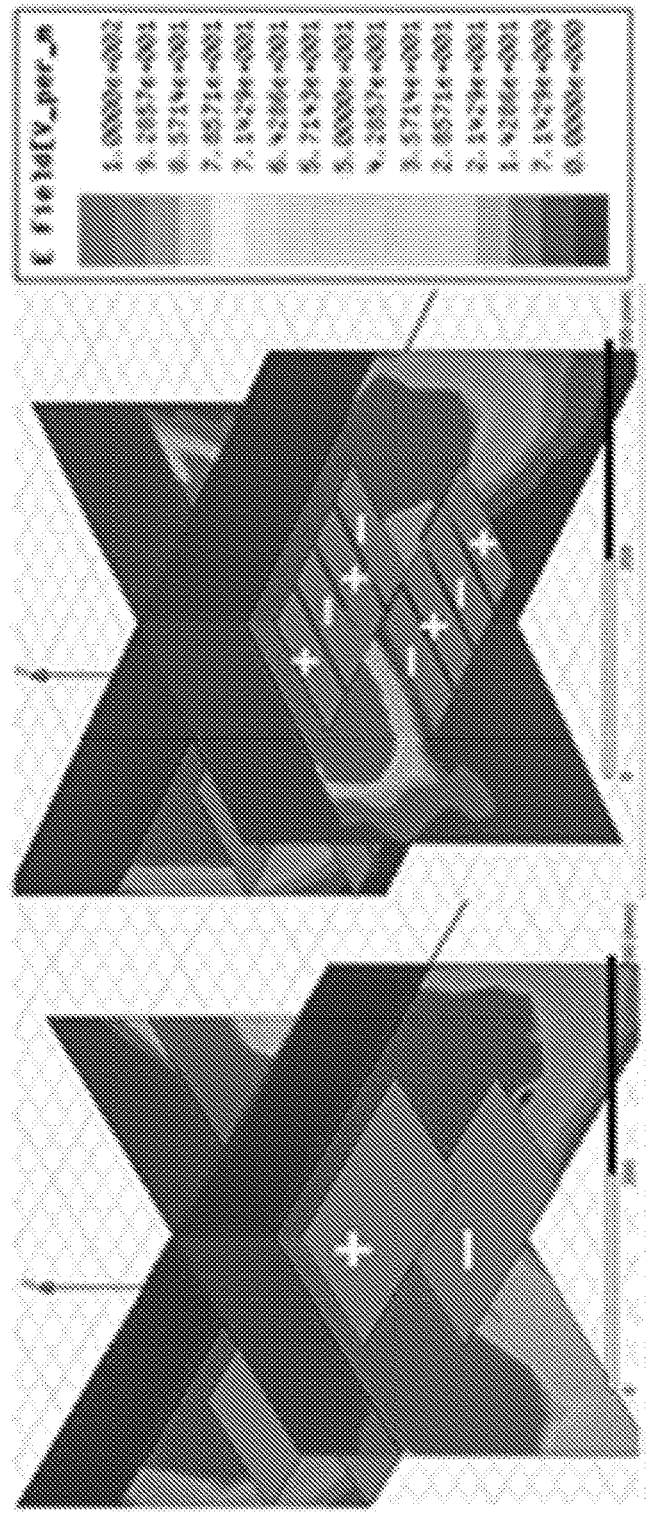
FIG. 3 shows example results of a simulation using Ansys HFSS finite element industry-standard software comparing the electric field strength in the field reduction zone for two example cases: the first with one module and the second with four modules.

Full-wave electromagnetic analysis may be used to determine the field cancelation effects of the number of modules employed in the multi-module capacitive wireless power transfer system and the relative placement of the coupling plates. As an example, FIG. 3 shows results of a simulation using Ansys HFSS finite element industry-standard software comparing an electric field profile and values for two cases: (1) two pairs of plates and (2) eight pairs of plates, where each plate is driven 180° out of phase from its neighbors. In this example, a total plate area is kept constant, in this case (2×20 cm×40 cm), assuming that a form factor within a vehicle or other device will be maintained. In the first example, the plates are driven with 1 kW of power and an input reactance is impedance matched. For the second case, the 1 kW is divided equally between plate excitations and each plate is separately impedance matched, since the end plates will have different reactances than the middle plates. In this example, reactances can be initially found from full-wave simulations relative to 50-Ω ports. In this way, the entire 1 kW is delivered in each case to matched loads on the plates in the vehicle. This example illustrates the reduction in electric field for the case of alternating out-phased plates, but the modular power electronics allows for any phase distribution provided by digital control of the inverter switches.

Figure 4:
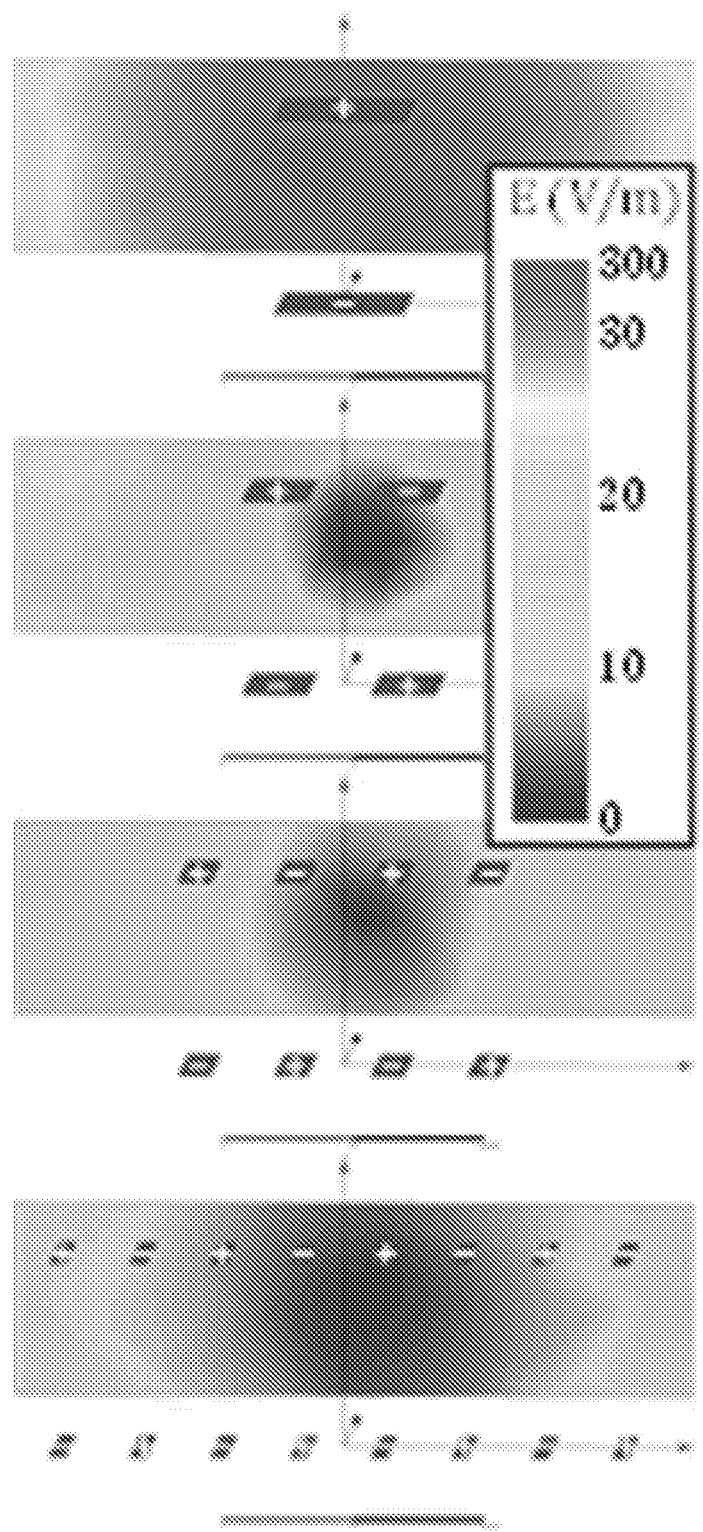
FIG. 4 shows results of another finite element simulation demonstrating a greater than five-fold reduction in electric field strength in the field reduction zone as the number of modules is increased from one to eight.

FIG. 4 shows results of another simulation demonstrating that as the number of adjacent out-of-phase (180 degree phase-shifted) pairs of plates is increased, the reduction in electric field strength in the field reduction zone also increases. Using eight modules (having eight pairs of plates) with adjacent plates alternately phase shifted by 180 degrees, for example, results in a greater than five-fold reduction in field strength in the field reduction zone while transferring the same amount of power across the coupling plates.

Relative phasing between neighboring plates that provide for field cancellation and focusing may be achieved by actively controlling the relative phase of the inverters in the individual modules shown in FIGS. 1 and 2. Since the rectifiers of the power conversion architecture shown in the implementation of FIG. 2, for example, are actively controllable, an additional control handle is available for plate phasing.

Figure 5:
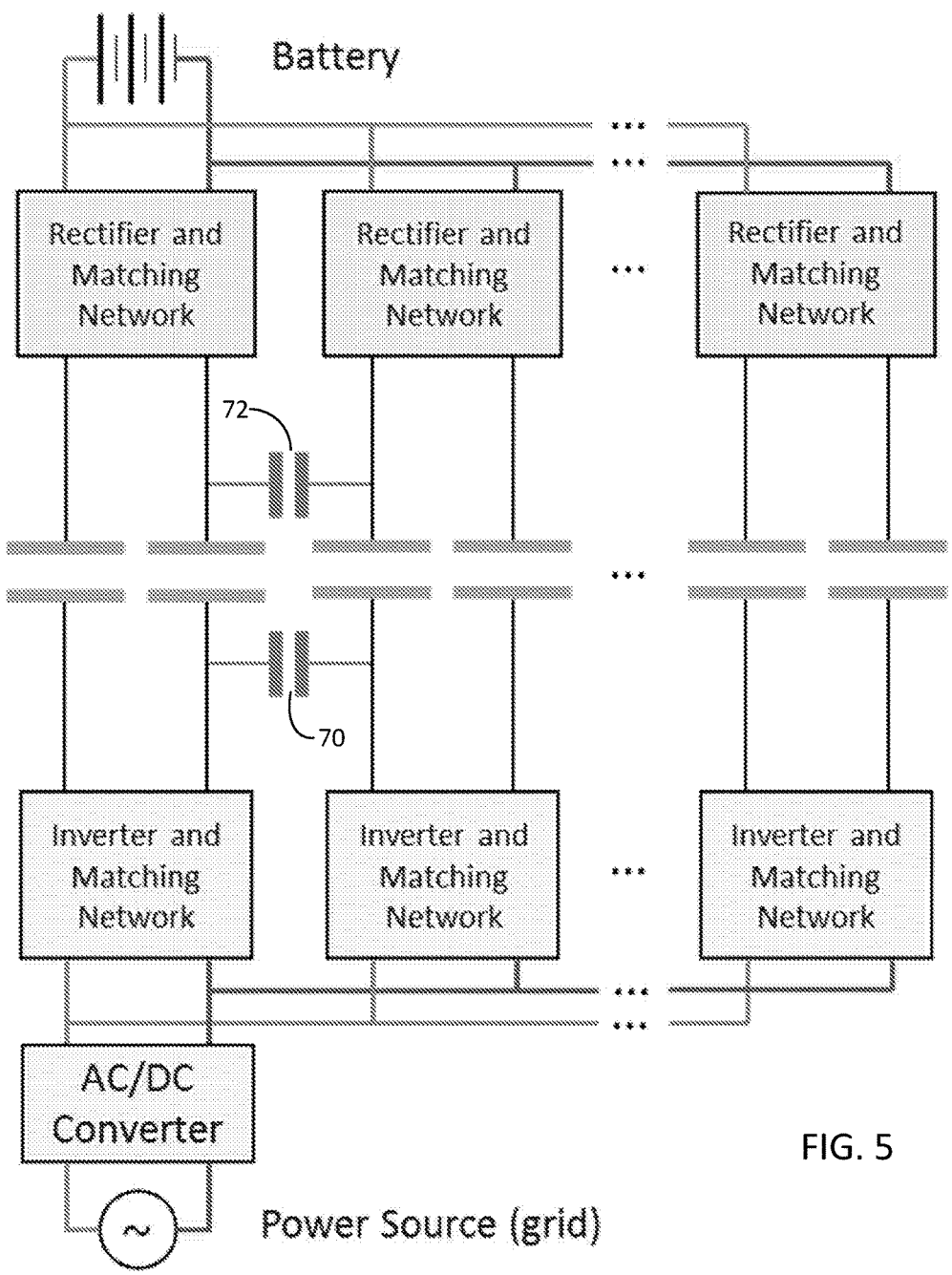
FIG. 5 shows a schematic diagram of the capacitive wireless power transfer system of FIG. 1, explicitly showing the parasitic capacitances between adjacent plates.

The larger the phase shift between adjacent modules (i.e., closer to 180 degrees), the greater the field reduction is in the surrounding zones. However, larger phase shifts also exacerbate the effect of parasitic capacitances between adjacent plates. FIG. 5, for example, shows a schematic diagram of the capacitive wireless power transfer system of FIG. 1, with the parasitic capacitances between adjacent plates clearly indicated. Although FIG. 5 shows the parasitic capacitances for two adjacent capacitive wireless transfer modules, these parasitic capacitances 70, 72 exist between all modules.

Figure 6:
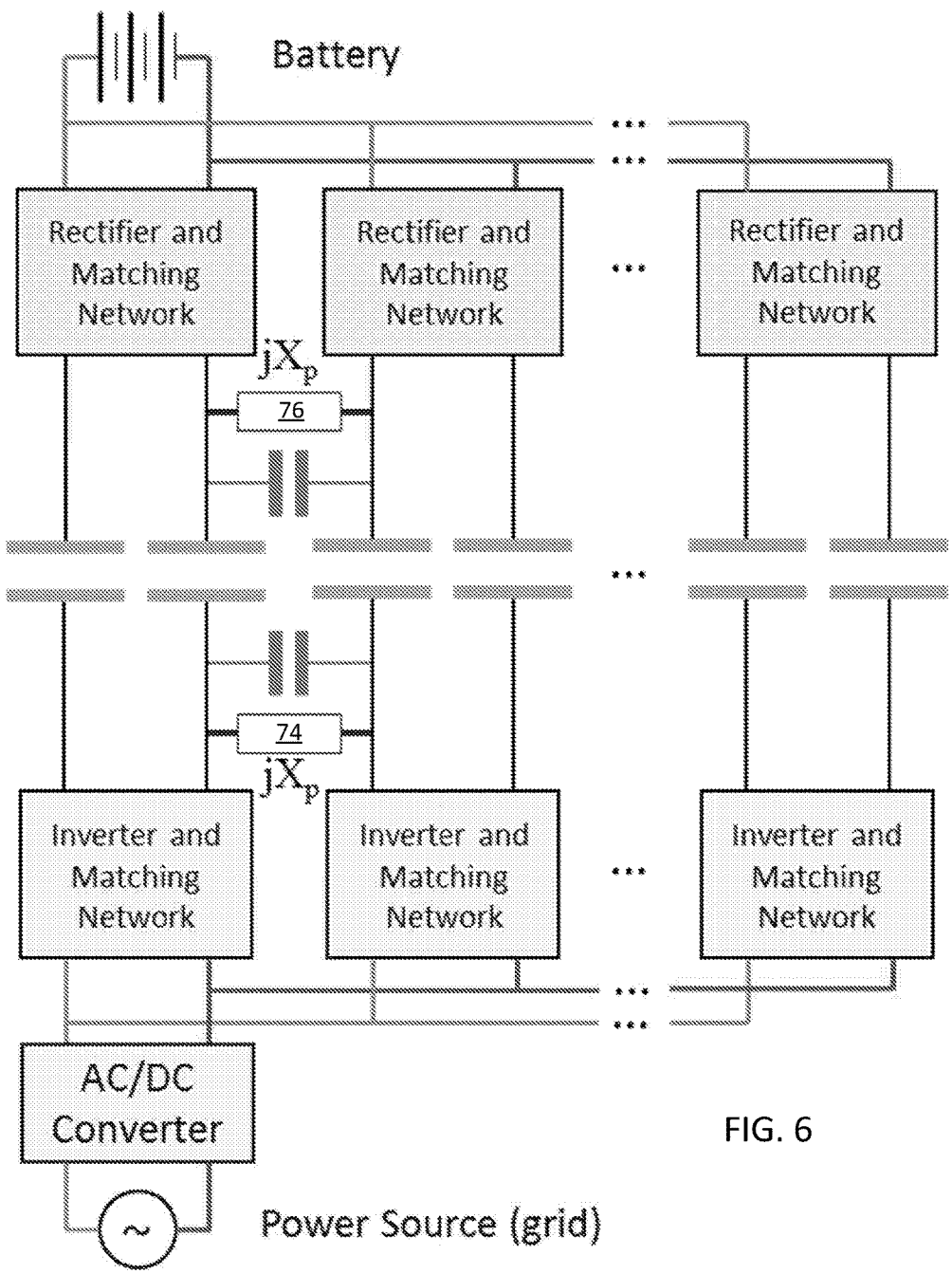
FIG. 6 shows a schematic diagram of the capacitive wireless power transfer system of FIG. 5 with shunt reactive networks coupled between adjacent coupling plates to tune out the parasitic capacitances between the adjacent plates.

The parasitic capacitances shown in FIG. 5 can adversely impact power transfer across the coupling plates. In many applications, such as large air-gap EV charging, the parasitic capacitances can be significantly larger than the coupling capacitances, resulting in a major portion of the instantaneous power being shuttled back to the power source through the parasitic capacitors. This effect can be mitigated by connecting shunt reactive networks 74, 76 in between adjacent coupling plates on the same side, as shown in FIG. 6. These shunt reactive networks present an inductive impedance $jX_p$ at the operating frequency of the module, which reduces or cancels out the capacitive impedance of the parasitic capacitors. In one implementation, for example, these shunt reactive networks may result in ideally infinite (and practically very large) effective impedance in the parasitic path between adjacent coupling plates, thus effectively preventing any power from being directed through this parasitic path. In one implementation, for example, the inductive impedance of a shunt reactive network is given by: $X_p = 1/(2\pi f_s C_p)$, where $C_p$ is the parasitic capacitance and $f_s$ is the operating frequency of the modules.

Figure 7:
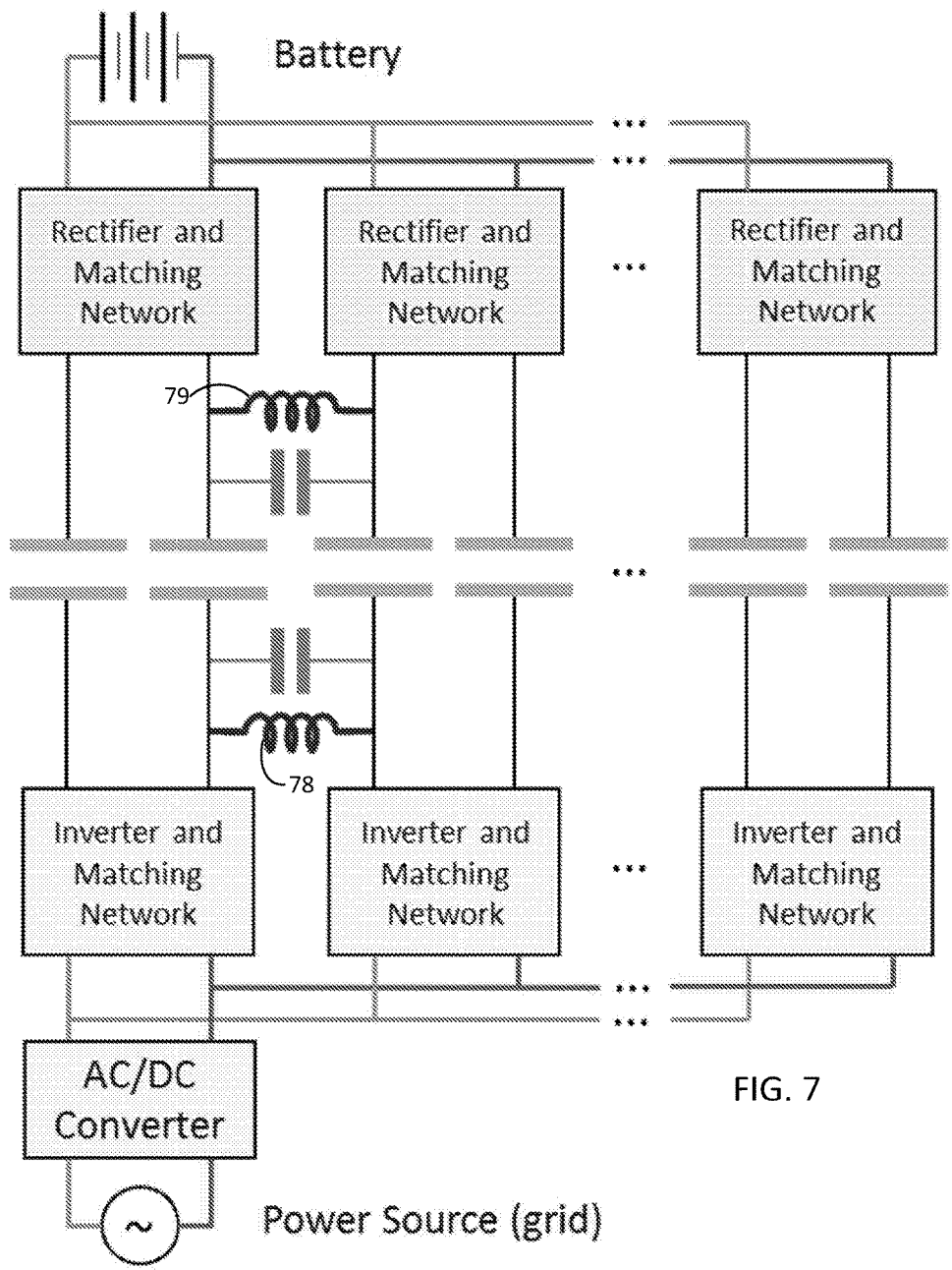
FIG. 7 shows a schematic diagram of the capacitive wireless power transfer system of FIG. 5 with inductors employed to realize the shunt reactive networks between adjacent plates to tune out parasitic capacitances between the adjacent plates.

In particular implementations, inductors 78, 79 may be employed to realize the shunt reactive networks between adjacent plates on the same side to tune out parasitic capacitance between these plates (as shown in FIG. 7). The tuning inductance in this implementation is given by: $L_p = 1/((2\pi f_s)^2 C_p)$, where $C_p$ is the parasitic capacitance and $f_s$ is the operating frequency of the modules. In other implementations, series or parallel LC circuits may also be employed to realize the shunt reactive networks.

In some implementations of a multi-module capacitive wireless power transfer architecture, it may be desirable to operate adjacent modules with phase shifts less than 180 degrees. Phase shifts smaller than 180 degrees may result in optimal field cancelation effects in implementations where the plates are not arranged in the rectangular grid like configuration of FIG. 2. Non-180 degree phase shifts may also provide optimal field cancelation for plate geometries/shapes other than rectangular. Furthermore, non-180 degree phase shifts reduce the effect of the parasitic capacitances discussed earlier, simplifying the design of the required shunt reactive tuning networks.

In some implementations, output power in the multi-module capacitive wireless power transfer system may be controlled by: (1) burst-mode control, that is, by turning the inverters and rectifiers of the modules on and off at a frequency much lower than their switching frequency; or (2) inverter-rectifier phase shift control, that is, by changing the phase shift between the inverter and rectifier of each individual module. Other output power control techniques (including, but not limited to, PWM and phase-shift PWM) are also possible when using specific types of inverters and rectifiers. For example, when full bridge inverters and/or full bridge rectifiers are used, output power may also be controlled by varying the phase shift between the legs of the inverter or the legs of the rectifiers, or by changing the duty ratio of an individual leg.

Figure 18:
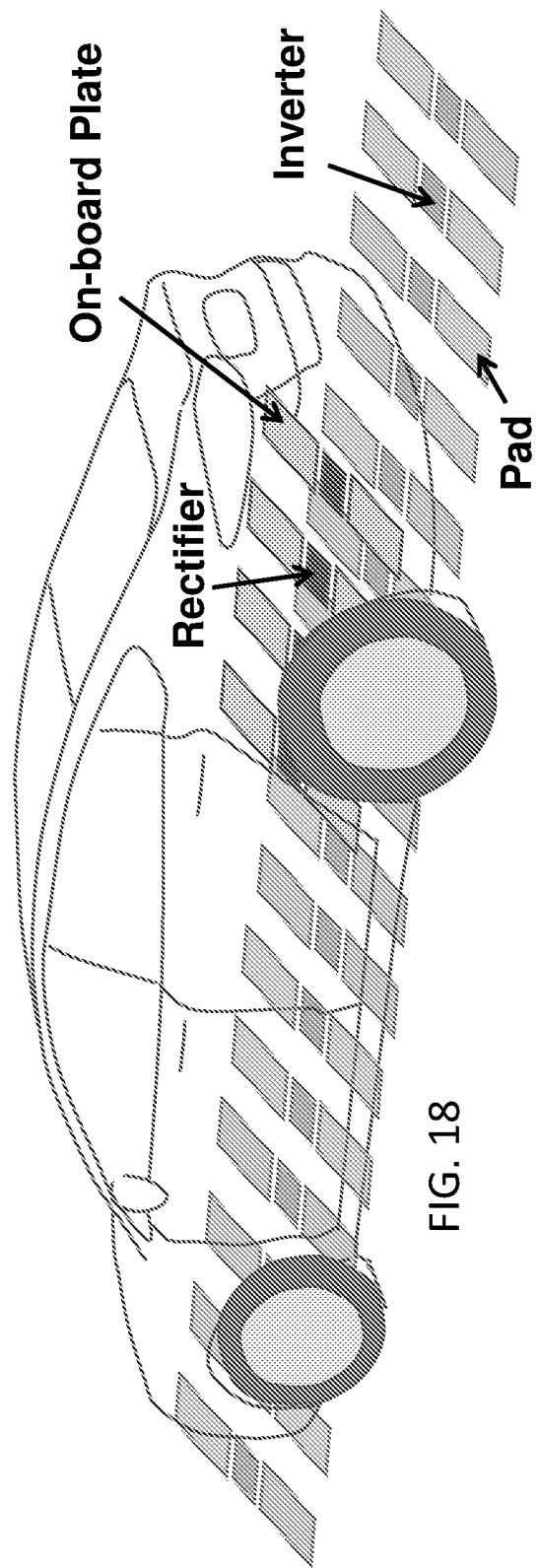
FIG. 18 shows one example implementation of a multi-module capacitive wireless power transfer system employed in an electric vehicle charging application.

FIG. 18 shows one example implementation of a vehicle battery charging wireless power transfer system. In this particular implementation, for example, the vehicle battery charging wireless power transfer system comprises a plurality of first coupling pads, such as mounted on a garage floor, garage wall, parking space roadway or other area that may be adjacent to a vehicle. The plurality of first coupling pads are coupled to one or more inverter to provide a voltage or current signal to the plurality of first coupling pads.

The plurality of first coupling pads, in turn, are adapted to wirelessly couple to a plurality of second coupling pads that are disposed (permanently or temporarily) on the vehicle when the vehicle is disposed adjacent the plurality of first coupling pads. The plurality of second coupling pads are further coupled to one or more battery of the vehicle via one or more rectifiers. Thus, power provided to the plurality of first coupling pads via the invert(s) is wirelessly transferred to the plurality of second coupling pads coupled to the vehicle and provide power to one or more batteries of the vehicle via one or more rectifiers.

Figure 8:
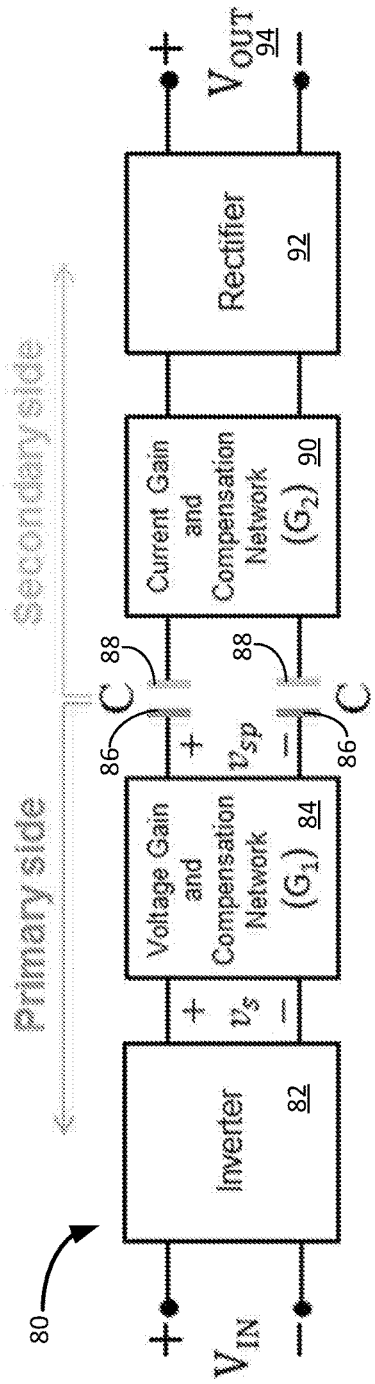
FIG. 8 shows a schematic diagram of an example architecture of one module of the multi-module capacitive wireless power transfer system, including one or more matching networks that provide voltage or current gain and reactive compensation.

FIG. 8 shows a schematic diagram of an example architecture of one module of the multi-module capacitive wireless power transfer system, including one or more matching networks that provide voltage or current gain and reactive compensation. In the implementation of FIG. 8, for example, a capacitive wireless transfer module includes an inverter 82 (e.g., a high-frequency inverter) feeding a first pair of coupling plates 86 via a first matching network 84. A second pair of coupling plates 88 is coupled with the first pair of coupling plates 86 and is connected to the load 94 via a second matching network 96. Although in the implementation shown in FIG. 8, the capacitive wireless transfer module includes two matching networks, other implementations may include only one matching network disposed on either the primary or secondary sides of the transfer plates.

In the particular architecture shown in FIG. 8, for example, a high-frequency inverter converts the dc input voltage into a high-frequency ac voltage, $v_s$, which is fed into a matching network that steps up the voltage. This creates a high voltage at the primary side of the coupling plates, $v_{sp}$, enabling high power transfer with low currents, and hence relatively low plate voltages and fringing fields. The voltage gain matching network also partially compensates the capacitive reactance of the coupling plates. The coupling plates are followed by a second matching network that steps the current back up to the level required at the output. This current gain network also provides the remaining compensation for the plate reactance.

Figure 9:
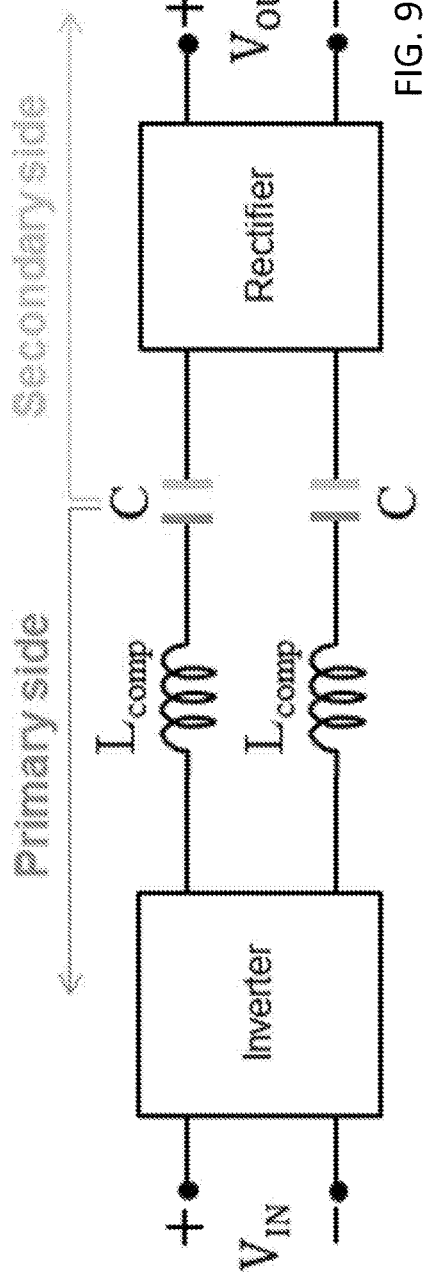
FIG. 9 shows an example matching network implementation that may be used in a capacitive wireless transfer module.

FIG. 9 shows an example matching network implementation that may be used in a capacitive wireless transfer module. In this implementation, the matching network includes one or more inductors added in series with the coupling plates of the module. An appropriately-valued inductor can be used to cancel the reactance of a capacitor at a given frequency. In the example implementation of a capacitive wireless power transfer module shown in FIG. 9, the two inductors in series collectively cancel, or compensate for, the capacitive reactance of the coupling plates, enabling effective power transfer. Although FIG. 9 shows two inductors arranged in series with the coupling plates of the module, the matching network may be implemented using a single inductor or more than two inductors.

Figure 10:
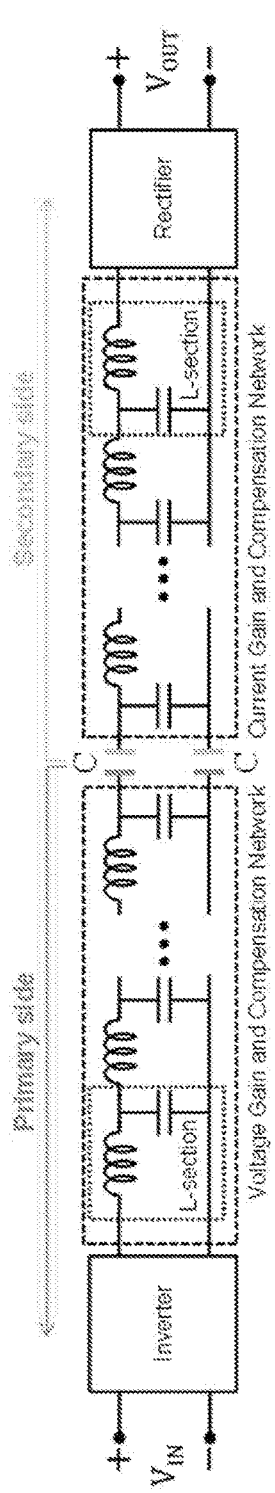
FIG. 10 shows a schematic diagram of an example implementation of a capacitive wireless transfer module including a multistage matching network comprising multiple L-section stages on the primary side and a multi-stage matching network comprising multiple L-section stages on the secondary side of the module.
Figure 11:
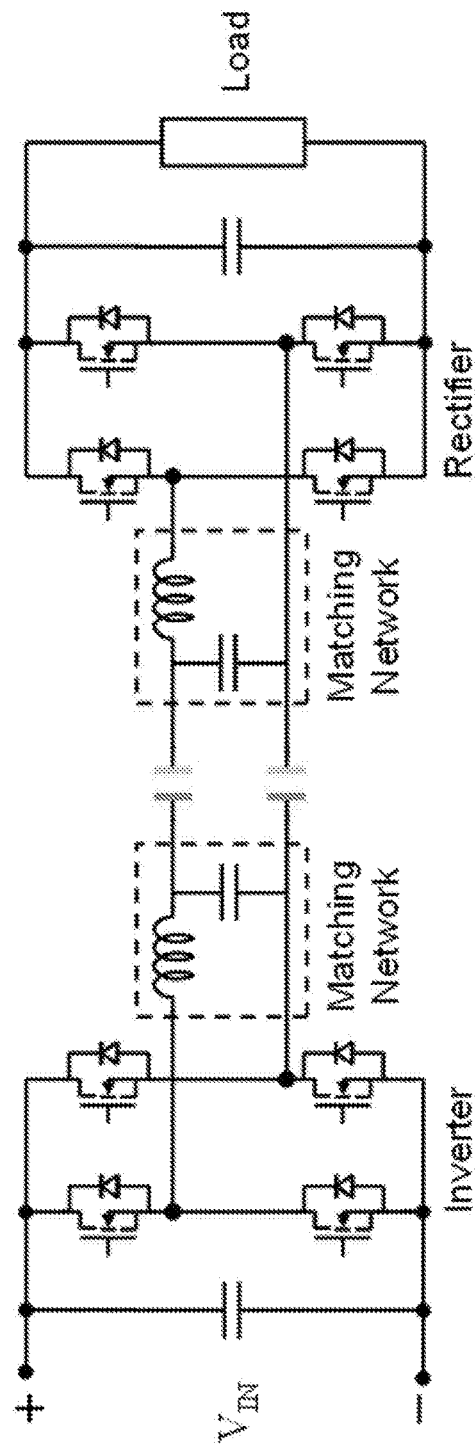
FIG. 11 shows another implementation of the multi-stage matching networks in a capacitive wireless transfer module in which each inductor is split into two—one connected in the forward path and one connected in the return path.

FIG. 10 shows a schematic diagram of an example implementation of a capacitive wireless transfer module including a multi-stage matching network comprising multiple L-section stages on the primary side and a multi-stage matching network comprising multiple L-section stages on the secondary side of the module. One of the plurality of L-section reactive matching network stages comprising an inductor and shunt capacitor is shown, for example by a dashed box. Other L-section reactive matching network stages may include any combination and arrangement of two or more reactive components (e.g., inductor or capacitor), such as but not limited to inductor and capacitor (LC), inductor only and capacitor only. The primary-side multi-stage matching network provides voltage gain and compensation for the capacitive reactance of the coupling plates. The secondary-side multi-stage matching network provides current gain and the remaining compensation for the capacitive reactance of the coupling plates. FIG. 11 shows another implementation of the multi-stage matching networks in a capacitive wireless transfer module in which each inductor is split into two—one connected in the forward path and one in the return path.

Figure 12:
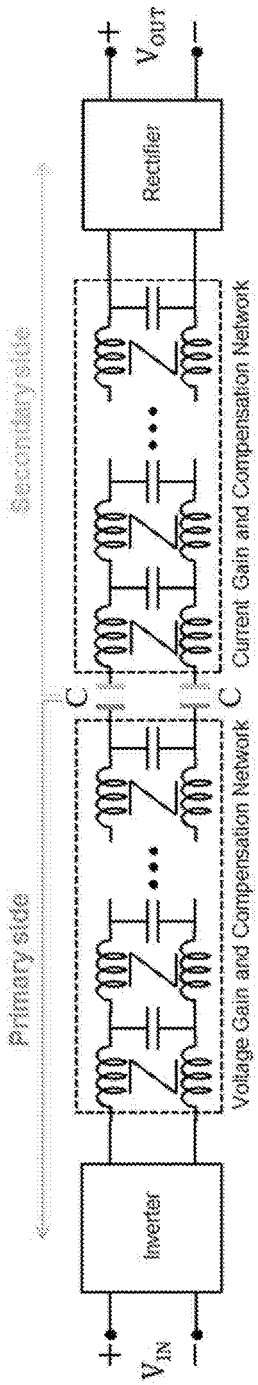
FIG. 12 shows another example implementation of a capacitive wireless transfer module with multi-stage L-section matching networks in which the inductors of the L-section stages are split into two—one connected in the forward path and one connected in the return path—and are magnetically coupled to one another.

FIG. 12 shows another example implementation of a capacitive wireless transfer module with multi-stage L-section matching networks in which the inductors of the L-section stages are split into two—one in the forward path and one in the return path—and are magnetically coupled to one another. Coupling the inductors in this manner doubles the inductance achieved as compared to the uncoupled case, hence requiring smaller inductors to achieve the required inductances. This improves the achievable inductor Quality factors, and hence the system efficiency.

Figure 13:
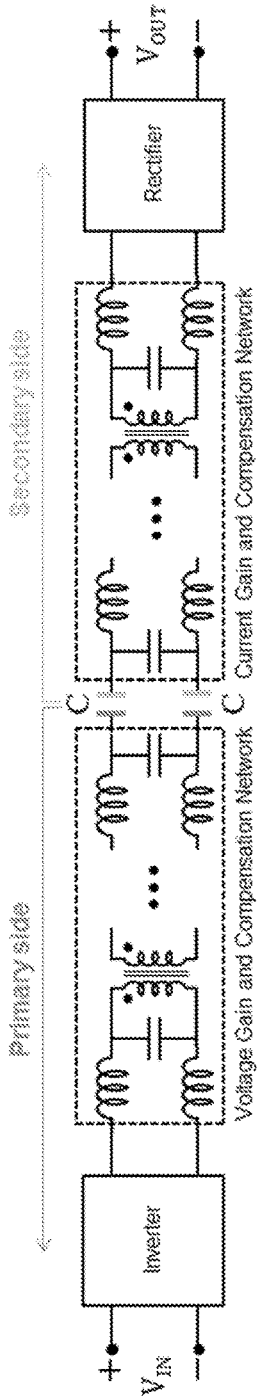
FIG. 13 shows yet another example implementation of a capacitive wireless power transfer module with multi-stage matching networks in which the multi-stage networks comprise a plurality of L-section stages and a plurality of transformer stages.

FIG. 13 shows yet another example implementation of a capacitive wireless power transfer module with multi-stage matching networks in which the multi-stage networks comprise a plurality of L-section stages and a plurality of transformer stages. The transformer(s) on the primary side provide voltage gain (turns ratio greater than 1), while the transformers on the secondary side provide current gain (turns ratio less than 1). The transformers can be placed as intermediate as well as terminating stages on both the primary and the secondary side of the module. Using transformers to provide a portion of the voltage and current gain reduces the gain requirements on the L-section stages, with potential benefits in their size and efficiency. For further performance benefits, the inductors in this implementation may also be coupled as described earlier.

Figure 14:
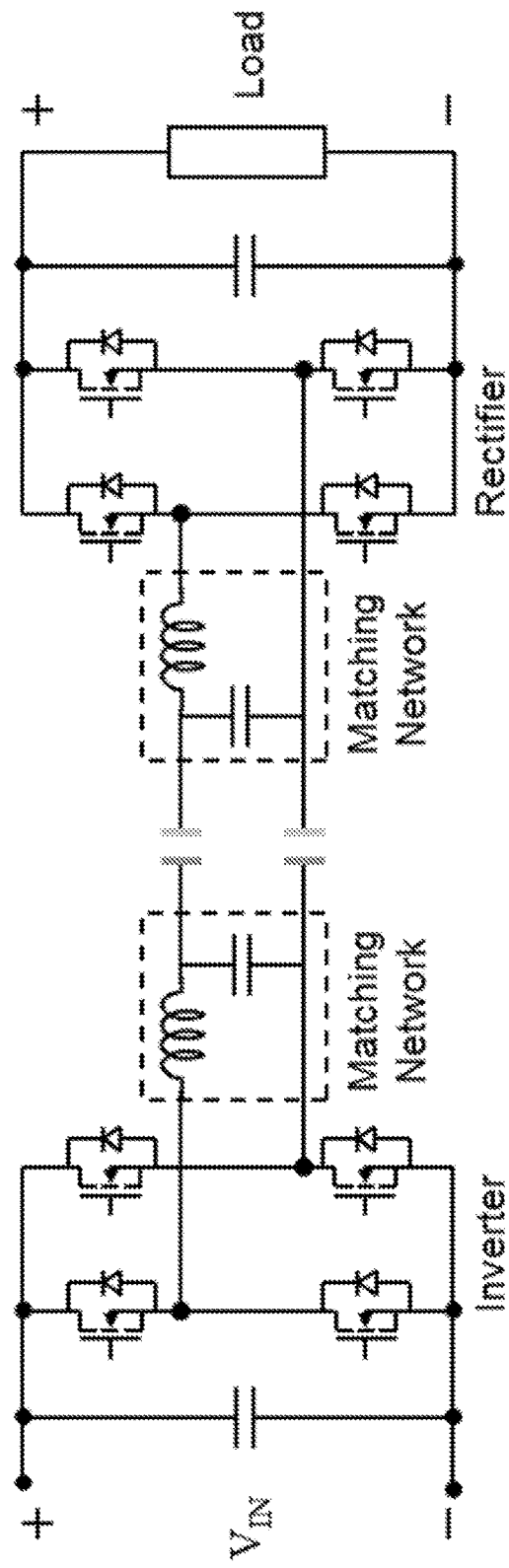
FIG. 14 shows a schematic diagram of an example capacitive wireless power transfer module including a full-bridge inverter and a full-bridge rectifier.

There are many possible implementations of the inverters and the rectifiers shown in the capacitive wireless power transfer modules of FIGS. 8 to 13. In one implementation, for example, a full-bridge inverter and a full-bridge rectifier may be employed as shown in FIG. 14. However, any other type of inverter, including but not limited to, other class D inverters (e.g., half-bridge inverter) and any of class DE, class E, class F, class E/F, class Phi or class Phi2 inverters may be employed. In addition to any voltage source inverter, any current-source or Z-source inverter may also be used. Likewise, any rectifier implementation can be used, including but not limited to class D (e.g., full bridge or half bridge rectifier), current doubler, class E, class F, class E/F, class Phi, class Phi2, and Z-source rectifiers, among others. There are also many ways to control these inverters and rectifiers and all of these control methods can be employed in the capacitive wireless power transfer modules.

Figure 15:
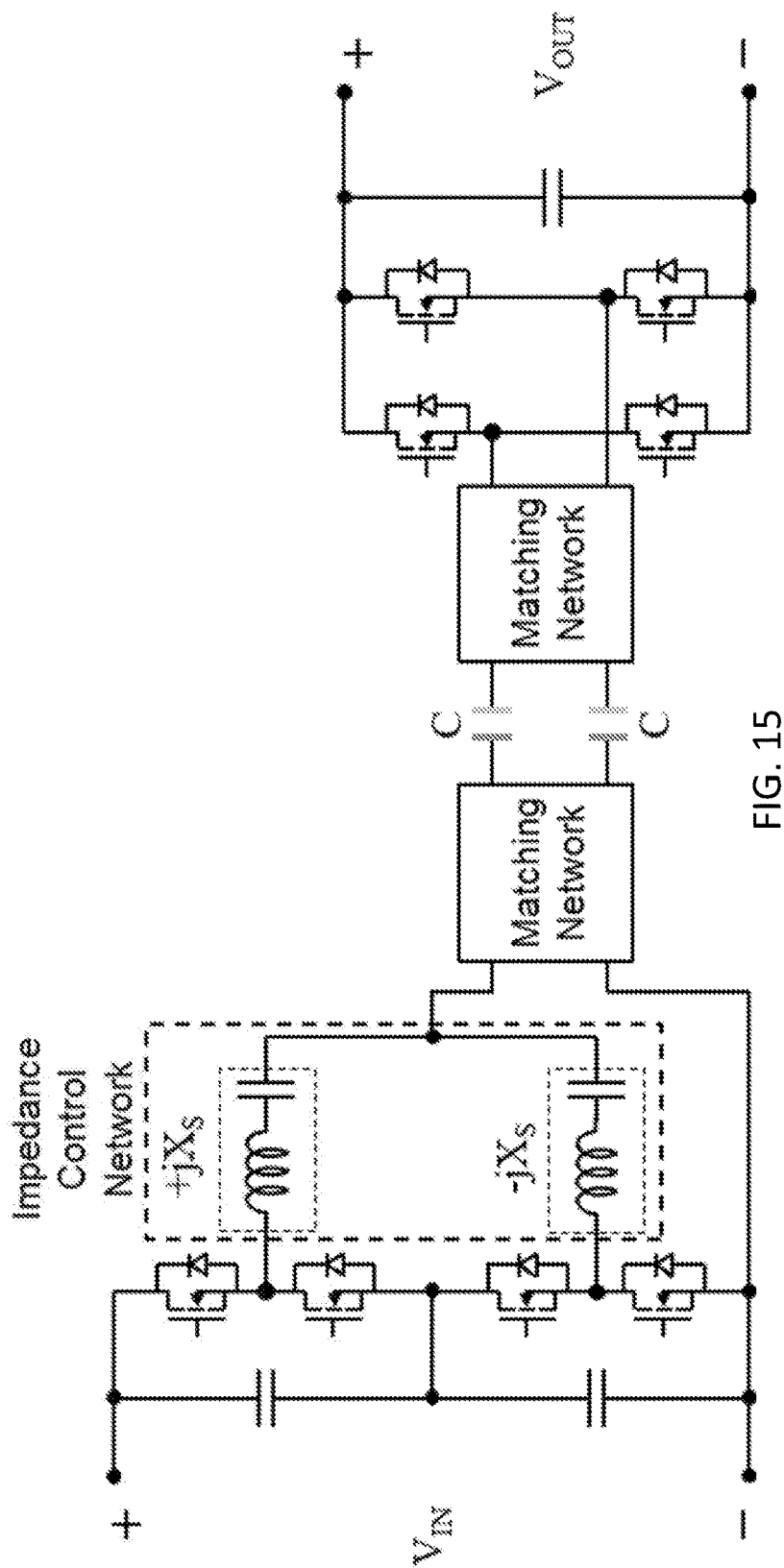
FIG. 15 shows a schematic diagram of another example of a capacitive wireless power transfer module wherein the inverters utilize an impedance control network to combine power.

In many capacitive wireless power transfer applications, the input DC voltage may be unregulated and may vary across a wide range. In such applications the inverter of the capacitive wireless power transfer module of FIG. 8 may employ an impedance control network to maintain high efficiency across wide input voltage variations. Such an implementation of the capacitive wireless power transfer module is shown in FIG. 15. The implementation of FIG. 15 has two half-bridge inverters feeding an impedance control network. The impedance control network comprises two reactive tanks connected to the outputs of the two inverters, realizing equal and opposite reactance, $+jX_s$ and $-jX_s$. The two inverters are operated with a specific phase shift between them, which is controlled such that the impedances seen at both the inverter outputs remain near-resistive across variations in input voltage, facilitating zero-voltage switching (ZVS) and near-zero current switching (ZCS). This ensures that the inverter, and the capacitive wireless power transfer module, maintains high efficiency across wide variations in input voltage.

In many capacitive wireless power transfer applications the impedance seen by the inverters of the modules may also vary because of changes in coupling between the coupling plates, as, for instance, may occur in a dynamic charging application. Inverters using impedance control networks may also be used to maintain high efficiencies in such applications.

Figure 16:
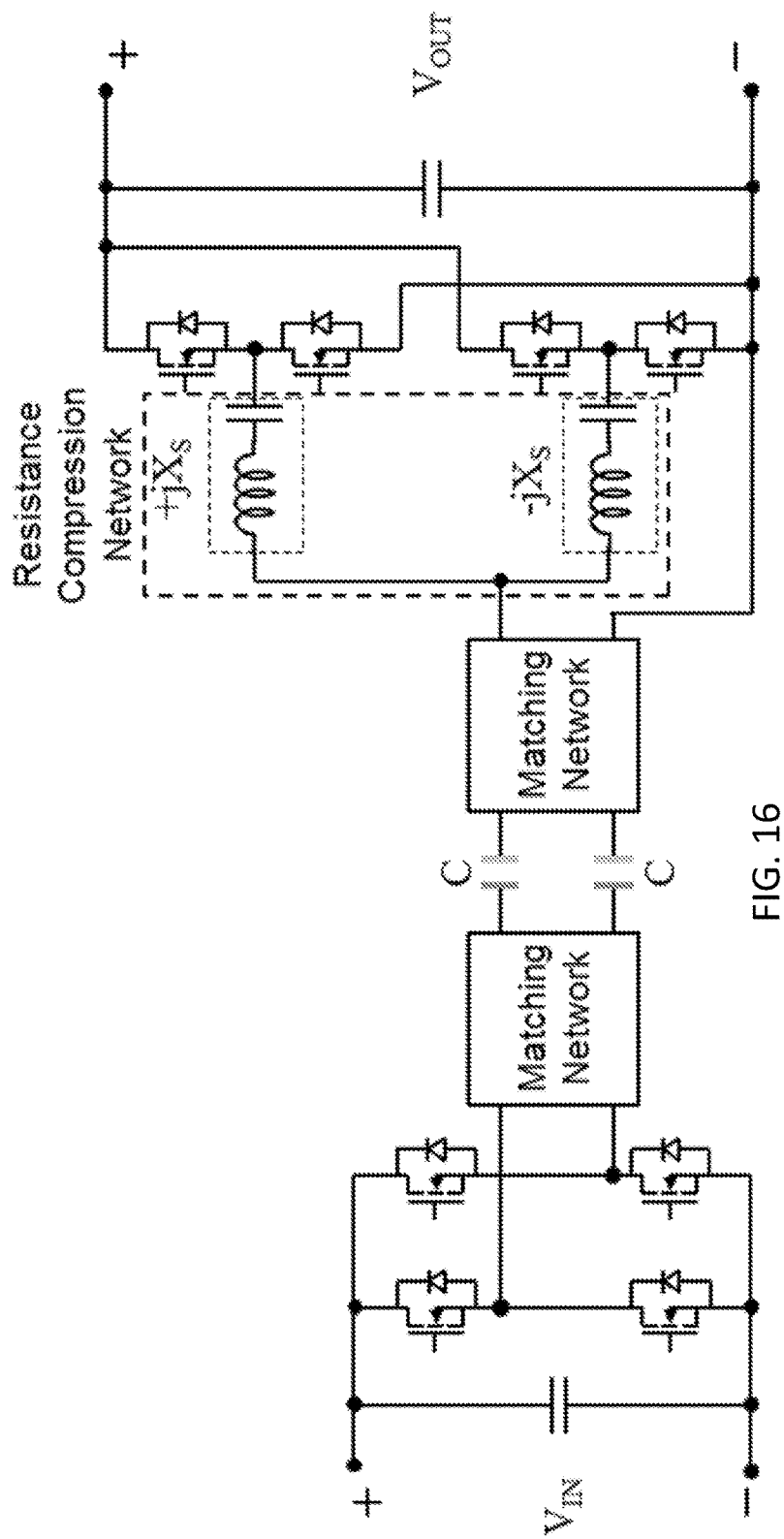
FIG. 16 shows a schematic diagram of yet another example of a capacitive wireless power transfer module wherein the rectifiers utilize a resistance compression network to split power.
Figure 17:
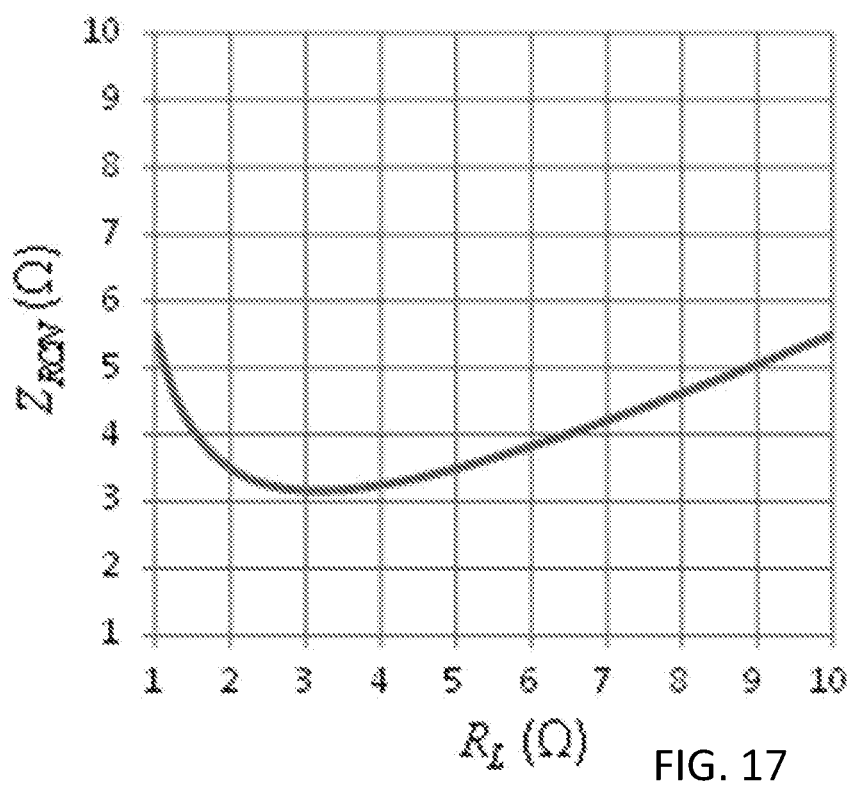
FIG. 17 shows the narrow range variation of the input impedance of a resistance compression network even as the load varies across a wide range.

In many capacitive wireless power transfer applications, the load may vary across wide ranges. For instance, in an EV charging application, the vehicle battery voltage may vary for different electric vehicles. In such applications the rectifier of the capacitive wireless power transfer module of FIG. 8 may employ a resistance compression network to maintain high efficiency across wide load variations. Such an implementation of the capacitive wireless power transfer module is shown in FIG. 16. The implementation of FIG. 16 has a resistance compression network feeding two half-bridge rectifiers. Even as the load of the capacitive wireless transfer module varies across wide ranges, the impedance seen at the input of the resistance compression network only varies across a narrow range. This effect is illustrated in FIG. 17. FIG. 17 shows that the variation in the impedance seen at the input of the RCN is limited to within a 2:1 range even as the load varies across a 10:1 range. Owing to this resistance compression effect of the RCN, the effective load seen by the capacitive wireless power transfer module varies across a narrow range, enabling high efficiency to be maintained across wide variations in output power levels.

Various example implementations of multi-module capacitive WPT architecture with field cancellation, including the use of a shunt inductor to tune out parasitic capacitance between adjacent plates is described in A. Kumar, S. Pervaiz, C. K. Chang, S. Korhummel, Z. Popovic and K. K. Afridi, "Investigation of Power Transfer Density Enhancement in Large Air-Gap Capacitive Wireless Power Transfer Systems," *Proceedings of the IEEE Wireless Power Transfer Conference (WPTC)*, Boulder, Colo., May, 2015, which is incorporated by reference in its entirety as if fully set forth herein. Other example implementations, such as a single module with an L-section matching network and transformer in which the capacitor of the L-section network is realized using the parasitic winding capacitance of the transformer is described in C. K. Chang, G. G. Da Silva, A. Kumar, S. Pervaiz and K. K. Afridi, "30 W Capacitive Wireless Power Transfer System with 5.8 pF Coupling Capacitance," *Proceedings of the IEEE Wireless Power Transfer Conference (WPTC)*, Boulder, Colo., May, 2015, which is also incorporated by reference in its entirety as if fully set forth herein.

Although implementations have been described above with a certain degree of particularity, those skilled in the art could make numerous alterations to the disclosed embodiments without departing from the spirit or scope of this invention. All directional references (e.g., upper, lower, upward, downward, left, right, leftward, rightward, top, bottom, above, below, vertical, horizontal, clockwise, and counterclockwise) are only used for identification purposes to aid the reader's understanding of the present invention, and do not create limitations, particularly as to the position, orientation, or use of the invention. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other. It is intended that all matter contained in the above description or shown in the accompanying drawings shall be interpreted as illustrative only and not limiting. Changes in detail or structure may be made without departing from the spirit of the invention as defined in the appended claims.

What is claimed is:

1. A multi-module capacitive wireless power transfer system comprising:
    a first capacitive wireless power transfer module comprising a plurality of first module first coupling plates adapted to receive a voltage or current at an operating frequency having a first phase and a plurality of first module second coupling plates adapted to be coupled to the plurality of first module first coupling plates for receiving wireless power; and
        a second capacitive wireless power transfer module comprising a plurality of second module first coupling plates adapted to receive a voltage or current at an operating frequency having a second phase different from the first phase and a plurality of second module second coupling plates adapted to be coupled to the plurality of second module first coupling plates for receiving wireless power.

2. The multi-module capacitive wireless power transfer system of claim 1 wherein the first capacitive wireless power transfer module comprises a first inverter that provides voltage or current at the operating frequency at the first phase and wherein the second capacitive wireless power transfer module comprises a second inverter that provides voltage or current at the operating frequency at the second phase.

3. The multi-module capacitive wireless power transfer system of claim 1 wherein at least one of the first module first coupling plates and at least one of the second module first coupling plates are disposed adjacent each other.

4. The multi-module capacitive wireless power transfer system of claim/wherein the at least one of the first module first coupling plates and the at least one second module first coupling plates are adapted to generate electrical fields having different phases, wherein the different phases at least partially cancel each other, at least partially cancel each other in at least one field reduction zone, and/or at least partially cancel each other in at least one field reduction zone comprising a field reduction below a predetermined field intensity.

5. The multi-module capacitive wireless power transfer system of claim 4 wherein the predetermined field intensity comprises a safe field intensity as defined by at least one of IEEE Std C95.1 and ICNIRP Guidelines for Limiting Exposure to Time-Varying Electric, Magnetic, and Electromagnetic Fields (UP TO 300 GHz).

6. The multi-module capacitive wireless power transfer system of claim 1 wherein the first and second phases are approximately 180 degrees out of phase.

7. The multi-module capacitive wireless power transfer system of claim 1 wherein a reactive network is disposed between at least one of the first module first coupling plates and at least one of the second module first coupling plates, wherein the reactive network comprises at least one inductor selected to compensate for or eliminate a parasitic capacitance between the at least one of the first module first coupling plates and the at least one of the second module first coupling plates.

8. The multi-module capacitive wireless power transfer system of claim 1 wherein the operating frequency is a fixed frequency.

9. The multi-module capacitive wireless power transfer system of claim 8 wherein the fixed frequency is in an Industrial, Scientific and Medical (ISM) frequency hand, wherein the ISM band frequency comprises at least one frequency selected from the group comprising: 6.78 MHz, 13.56 MHz, 27.12 MHz, 40.68 MHz, 433.92 MHz, 915 MHz, 2.45 GHz, 5.8 GHz, 24.125 GHz, 61.25 GHz, 122.5 GHz and 245 GHz.

10. The multi-module capacitive wireless power transfer system of claim 1 wherein the system comprises: a power source and a load,
    wherein the first capacitive wireless power transfer module comprises a first inverter coupled to the power source and is adapted to provide voltage or current at the operating frequency at the first phase to the first module first coupling plates and the second capacitive wireless power transfer module comprises a second inverter coupled to the power source and is adapted to provide voltage or current at the operating frequency at the second phase to the second module first coupling plates, and
    wherein the load is coupled to the first module second coupling plates and the second module second coupling plates.

11. The multi-module capacitive wireless power transfer system of claim 1 wherein the first module first coupling plates are adapted to be coupled to a power source via an inverter, the first module second coupling plates are adapted to be coupled to a load and to the first module plurality of first coupling plates for receiving wireless power, wherein the first capacitive wireless power transfer module comprises a matching network adapted to provide reactive compensation and gain between at least one of the inverter and the first module plurality of first coupling plates and the first module plurality of second coupling plates and the load, and the matching network comprises a reactive matching network and a transformer, wherein the reactive matching network comprises an L-section reactive matching network.

12. A capacitive wireless power transfer system comprising:
    a plurality of first coupling plates adapted to be coupled to a power source via an inverter;
    a plurality of second coupling plates adapted to be coupled to a load and to the plurality of first coupling plates for receiving wireless power; and a matching network adapted to provide reactive compensation and gain between at least one of the:
the inverter and the plurality of first coupling plates, and
the plurality of second coupling plates and the load, wherein the matching network comprises a reactive matching network comprising at least two reactive components and a transformer.

13. The system of claim 12 wherein the matching network is adapted to provide reactive compensation and gain between the inverter and the plurality of first coupling plates, and the plurality of second coupling plates and the load.

14. The system of claim 12 wherein the matching network comprises a compensating inductor, a shunt capacitor and a transformer, wherein the compensating inductor is coupled to a primary coil of the transformer and is adapted to further be coupled to the inverter or the load and/or the shunt capacitor comprises a parasitic winding capacitance of the transformer.

15. The system of claim 12 wherein the matching network comprises at least one of the group comprising:
a plurality of L-section stages
a plurality of transformers;
comprises three reactive components: two reactive components in series, and one reactive component in shunt position in place of the reactive matching network; and
at least two magnetically coupled inductors.

16. The system of claim 12 wherein the plurality of second coupling plates are adapted to be coupled to a battery.

17. The system of claim 12 wherein the plurality of first coupling plates are adapted to be coupled to an inverter powered by a power source, wherein the power source comprises at least one of the group comprising: a dc power source, an ac power source, a battery, and an ac grid.

18. The system of claim 12 wherein the capacitive wireless power transfer system is adapted to operate at least one of the group comprising:
a frequency of at least about 150 kHz;
a plurality of transformers;
comprises three reactive components: two reactive components in series, and one reactive component in shunt position in place of the reactive matching network; and
at least two magnetically coupled inductors.

19. The system of claim 12 wherein the capacitive wireless power transfer system is adapted to be operated with a phase shift between legs of the inverter and/or phase shift between legs of the rectifier.

20. The system of claim 12 wherein the inverter comprises a plurality of inverters disposed between a power source and the plurality of first coupling plates, wherein the plurality of inverters utilize an impedance control network to combine power.

21. The system of claim 12 wherein the rectifier comprises a plurality of rectifiers disposed between the plurality of second coupling plates and the load, wherein the plurality of rectifiers utilize a resistance compression network to split power.

22. The system of claim 12 wherein the inverter comprises a plurality of inverters disposed between a power source and the plurality of first coupling plates and the rectifier comprises a plurality of rectifiers disposed between the plurality of second coupling plates and the load.

23. A method of providing capacitive wireless power transfer, the method comprising:
providing a plurality of first coupling plates adapted to be coupled to a power source;
providing a plurality of second coupling plates adapted to be coupled to the plurality of first coupling plates for receiving wireless power; and
providing reactive compensation and gain between the plurality of first coupling plates, wherein the operation of providing reactive compensation and gain comprises providing a matching network adapted to provide reactive compensation and gain between at least one of the:
the inverter and the plurality of first coupling plates, and
the plurality of second coupling plates and the load,
wherein the matching network comprises a reactive matching network comprising at least two reactive components and a transformer.

24. The method of claim 23 wherein the operation of providing reactive compensation and gain comprises providing reactive compensation and gain between the inverter and the plurality of first coupling plates, and the plurality of second coupling plates and the load.

25. The method of claim 23 wherein the matching network comprises a compensating inductor, a shunt capacitor and a transformer, wherein the compensating inductor is coupled to a primary coil of the transformer and is adapted to further be coupled to the inverter or the load and/or the shunt capacitor comprises a parasitic winding capacitance of the transformer.

* * * * *